United States Patent
Bak et al.

(10) Patent No.: US 10,109,676 B2
(45) Date of Patent: Oct. 23, 2018

(54) MTJ STRUCTURES INCLUDING MAGNETISM INDUCTION PATTERN AND MAGNETORESISTIVE RANDOM ACCESS MEMORY DEVICES INCLUDING THE SAME

(71) Applicant: SAMSUNG ELECTRONICS CO., LTD., Suwon-si, Gyeonggi-do (KR)

(72) Inventors: Jung-Hoon Bak, Suwon-si (KR); Woo-Jin Kim, Hwaseong-si (KR); Mina Lee, Seoul (KR); Gwan-Hyeob Koh, Seoul (KR); Yoon-Jong Song, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 32 days.

(21) Appl. No.: 15/293,771

(22) Filed: Oct. 14, 2016

(65) Prior Publication Data

US 2017/0110509 A1    Apr. 20, 2017

(30) Foreign Application Priority Data

Oct. 15, 2015  (KR) .................. 10-2015-0143991
Aug. 22, 2016  (KR) .................. 10-2016-0106010

(51) Int. Cl.

| | |
|---|---|
| *H01L 27/22* | (2006.01) |
| *H01L 43/02* | (2006.01) |
| *H01L 43/08* | (2006.01) |
| *G11C 11/16* | (2006.01) |
| *H01L 43/10* | (2006.01) |

(52) U.S. Cl.
CPC .......... *H01L 27/228* (2013.01); *G11C 11/161* (2013.01); *H01L 43/02* (2013.01); *H01L 43/08* (2013.01); *H01L 43/10* (2013.01)

(58) Field of Classification Search
CPC ..... G11C 11/161; H01L 27/228; H01L 43/02; H01L 43/08; H01L 43/10
See application file for complete search history.

(56) References Cited

U.S. PATENT DOCUMENTS

| | | | |
|---|---|---|---|
| 6,826,023 | B2 | 11/2004 | Hayakawa |
| 7,813,088 | B2 | 10/2010 | Tsunekawa et al. |
| 7,826,256 | B2 | 11/2010 | Zheng et al. |
| 8,058,697 | B2 | 11/2011 | Guo et al. |
| 8,279,666 | B2 | 10/2012 | Dieny et al. |
| 8,686,520 | B2 | 4/2014 | Worledge |

(Continued)

FOREIGN PATENT DOCUMENTS

JP    2010-045060 A    2/2010

*Primary Examiner* — Laura Menz
*Assistant Examiner* — Candice Y Chan
(74) *Attorney, Agent, or Firm* — Lee & Morse, P.C.

(57) ABSTRACT

A magnetic tunnel junction (MTJ) structure includes a fixed layer pattern structure having a perpendicular magnetization direction, a tunnel barrier pattern on the fixed layer pattern structure, a free layer pattern on the tunnel barrier pattern, the free layer pattern having a perpendicular magnetization direction, a first surface magnetism induction pattern on the free layer pattern, the first surface magnetism induction pattern inducing a perpendicular magnetism in a surface of the free layer pattern, a conductive pattern on the first surface magnetism induction pattern, and a ferromagnetic pattern on the conductive pattern.

13 Claims, 7 Drawing Sheets

(56) References Cited

U.S. PATENT DOCUMENTS

| | | |
|---|---|---|
| 8,704,319 B2 | 4/2014 | Tang et al. |
| 2006/0128038 A1 | 6/2006 | Pakala et al. |
| 2006/0180839 A1* | 8/2006 | Fukumoto .............. B82Y 25/00 257/295 |
| 2008/0253039 A1 | 10/2008 | Nagamine et al. |
| 2008/0253174 A1* | 10/2008 | Yoshikawa ........... H01L 27/228 365/158 |
| 2009/0079018 A1* | 3/2009 | Nagase ................. B82Y 25/00 257/421 |
| 2012/0287696 A1 | 11/2012 | Ohmori et al. |
| 2013/0032910 A1 | 2/2013 | Jung et al. |
| 2013/0234266 A1 | 9/2013 | Prejbeanu et al. |
| 2015/0028440 A1 | 1/2015 | Liu et al. |

* cited by examiner

MTJ STRUCTURES INCLUDING MAGNETISM INDUCTION PATTERN AND MAGNETORESISTIVE RANDOM ACCESS MEMORY DEVICES INCLUDING THE SAME

CROSS-REFERENCE TO RELATED APPLICATIONS

Korean Patent Application Nos. 10-2015-0143991, filed on Oct. 15, 2015, and 10-2016-0106010, filed on Aug. 22, 2016, in the Korean Intellectual Property Office, and entitled: "MTJ Structures and Magnetoresistive Random Access Memory Devices Including the Same," are incorporated by reference herein in its entirety.

BACKGROUND

Example embodiments relate to magnetic tunnel junction (MTJ) structures and magnetoresistive random access memory (MRAM) devices including the same.

SUMMARY

Embodiments are directed to a magnetic tunnel junction (MTJ) structure including a fixed layer pattern structure having a perpendicular magnetization direction, a tunnel barrier pattern on the fixed layer pattern structure, a free layer pattern on the tunnel barrier pattern, the free layer pattern having a perpendicular magnetization direction, a first surface magnetism induction pattern on the free layer pattern, the first surface magnetism induction pattern inducing a perpendicular magnetism in a surface of the free layer pattern, a conductive pattern on the first surface magnetism induction pattern, and a ferromagnetic pattern on the conductive pattern.

Embodiments are also directed to a magnetic tunnel junction (MTJ) structure including a fixed layer pattern structure having a perpendicular magnetization direction, a tunnel barrier pattern on the fixed layer pattern structure, a free layer pattern on the tunnel barrier pattern, the free layer pattern having a perpendicular magnetization direction, a conductive pattern on the free layer pattern, a surface magnetism induction pattern on the conductive pattern, and a ferromagnetic pattern on the surface magnetism induction pattern. The surface magnetism induction pattern induces a perpendicular magnetism in a surface of the ferromagnetic pattern.

Embodiments are also directed to a magnetic random access memory (MRAM) device including a lower electrode on a substrate, a magnetic tunnel junction (MTJ) structure on the lower electrode, and an upper electrode on the MTJ structure. The MTJ structure includes a fixed layer pattern structure having a perpendicular magnetization direction, a tunnel barrier pattern on the fixed layer pattern structure, a free layer pattern on the tunnel barrier pattern, the free layer pattern having a perpendicular magnetization direction, a first surface magnetism induction pattern on the free layer pattern, the first surface magnetism induction pattern inducing a perpendicular magnetism in a surface of the free layer pattern, a conductive pattern on the first surface magnetism induction pattern, and a ferromagnetic pattern on the conductive pattern Embodiments are also directed to a magnetic random access memory (MRAM) device including a lower electrode on a substrate, a (magnetic tunnel junction) MTJ structure on the lower electrode, and an upper electrode on the MTJ structure. The MTJ structure includes a fixed layer pattern structure having a perpendicular magnetization direction, a tunnel barrier pattern on the fixed layer pattern structure, a free layer pattern on the tunnel barrier pattern, the free layer pattern having a perpendicular magnetization direction, a conductive pattern on the free layer pattern, a surface magnetism induction pattern on the conductive pattern, and a ferromagnetic pattern on the surface magnetism induction pattern. The surface magnetism induction pattern induces a perpendicular magnetism in a surface of the ferromagnetic pattern.

Embodiments are also directed to a magnetic tunnel junction (MTJ) structure including a fixed layer pattern structure having a perpendicular magnetization direction, a tunnel barrier pattern on the fixed layer pattern structure, the tunnel barrier layer including or being made of MgO or AlOx, a free layer pattern on the tunnel barrier pattern, the free layer pattern having a perpendicular magnetization direction, a conductive pattern on the first surface magnetism induction pattern, a ferromagnetic pattern on the conductive pattern, and at least one of a first MgO pattern between the free layer pattern and the conductive pattern and a second MgO pattern between the conductive pattern and the ferromagnetic pattern. The first MgO pattern and the second MgO pattern each have a thickness that is equal to or less than one-half of a thickness of the tunnel barrier layer.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings.

Figure 1:
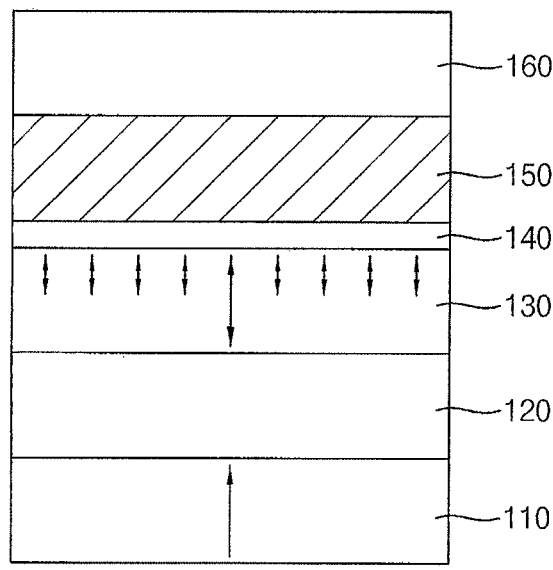
FIG. 1 illustrates a cross-sectional view depicting a magnetic tunnel junction (MTJ) structure of a magnetic random access memory (MRAM) device in accordance with example embodiments.

FIG. 1 illustrates a cross-sectional view depicting a magnetic tunnel junction (MTJ) structure of a magnetic random access memory (MRAM) device in accordance with example embodiments.

Referring to FIG. 1, the MTJ structure may include a fixed layer pattern structure 110, a tunnel barrier pattern 120, a free layer pattern 130, a first surface magnetism induction pattern 140, a conductive pattern 150 and a ferromagnetic pattern 160 sequentially stacked.

The fixed layer pattern structure may have a perpendicular magnetization direction. Herein, the description of a layer pattern having a "perpendicular magnetization direction"

indicates a magnetization direction parallel to a thickness of the layer pattern and perpendicular to an extending direction of the layer pattern.

The fixed layer pattern structure 110 may include a pinning layer pattern, a lower ferromagnetic pattern, an anti-ferromagnetic coupling spacer and an upper ferromagnetic pattern sequentially stacked. Each of the lower ferromagnetic pattern and the upper ferromagnetic pattern may have a perpendicular magnetization direction by the pinning layer pattern.

The pinning layer pattern may include, e.g., FeMn, IrMn, PtMn, MnO, MnS, MnTe, $MnF_2$, $FeF_2$, $FeCl_2$, FeO, $CoCl_2$, CoO, $NiCl_2$, NiO, and/or Cr. The lower and upper ferromagnetic patterns may include, e.g., Fe, Ni, and/or Co. The anti-ferromagnetic coupling spacer may include, e.g., Ru, Ir, and/or Rh.

The tunnel barrier pattern 120 may include, e.g., magnesium oxide (MgO) or aluminum oxide (AlOx).

The free layer pattern 130 may have a perpendicular magnetization direction. The free layer pattern 130 may include a ferromagnetic material. For example, the free layer pattern 130 may include, e.g., Fe, Ni, and/or Co.

The first surface magnetism induction pattern 140 may contact an upper surface of the free layer pattern 130. The first surface magnetism induction pattern 140 may induce a magnetism perpendicular to the upper surface of the free layer pattern 130. The first surface magnetism induction pattern 140 may include, e.g., magnesium oxide (MgO).

The first surface magnetism induction pattern 140 may have a thickness less than that of the tunnel barrier pattern 120. For example, the thickness of the first surface magnetism induction pattern 140 may be equal to or less than half of the thickness of the tunnel barrier pattern 120.

The conductive pattern 150 may include a metal. The conductive pattern 150 may include copper, aluminum, and/or tungsten. The conductive pattern 150 may be also referred to as a conductive spacer.

The ferromagnetic pattern 160 may include a perpendicular magnetic layer, an in-plane magnetic layer, or a resonance layer. The ferromagnetic pattern 160 may include Fe, Ni, and/or Co.

The first surface magnetism induction pattern 140 may contact the upper surface of the free layer pattern 130 and induce a perpendicular magnetism therein. Thus, a tunnel magnetic resistance (TMR) of the MTJ structure may be increased. The first surface magnetism induction pattern 140 may have a thickness that is less than that of the tunnel barrier pattern 120. Thus, the total resistance of the MTJ structure may not be increased very much even if the MTJ structure includes the first surface magnetism induction pattern 140.

The conductive pattern 150 may include a metal between the free layer pattern 130 and the ferromagnetic pattern 160, which may include a ferromagnetic material. Thus, a spin torque may be created between the free layer pattern 130 and the ferromagnetic pattern 160 by free electrons included in the metal, and thus, the switching current of the MTJ structure may be reduced. When the conductive pattern 150 includes the metal, the total resistance of the MTJ structure may be decreased.

Figure 2:
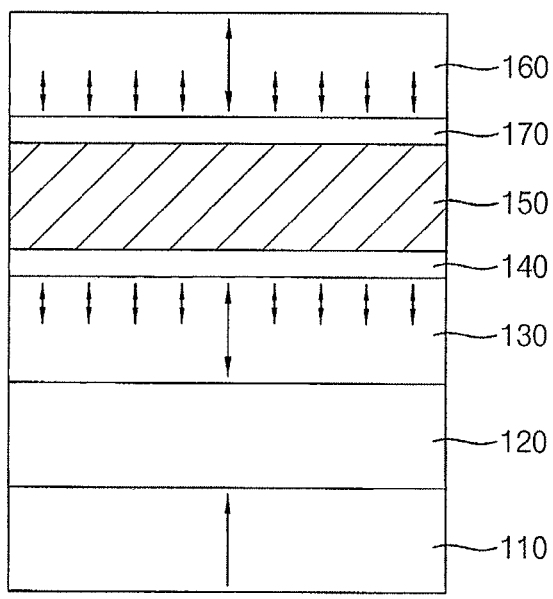
FIG. 2 illustrates a cross-sectional view depicting an MTJ structure of an MRAM device in accordance with example embodiments.

FIG. 2 illustrates a cross-sectional view depicting an MTJ structure of an MRAM device in accordance with example embodiments. The MTJ structure may be substantially the same as or similar to that of FIG. 1, except for including a second surface magnetism induction pattern 170 between the conductive pattern 150 and the ferromagnetic pattern 160. Thus, detailed descriptions of like elements are not repeated herein.

Referring to FIG. 2, the MTJ structure may include the fixed layer pattern structure 110, the tunnel barrier pattern 120, the free layer pattern 130, the first surface magnetism induction pattern 140, the conductive pattern 150, a second surface magnetism induction pattern 170, and the ferromagnetic pattern 160 sequentially stacked.

The second surface magnetism induction pattern 170 may be formed between the conductive pattern 150 and the ferromagnetic pattern 160. The second surface magnetism induction pattern 170 may contact a lower surface of the ferromagnetic pattern 160 and may induce a magnetism perpendicular to the lower surface of the ferromagnetic pattern 160. The second surface magnetism induction pattern 170 may include, e.g., magnesium oxide (MgO).

The second surface magnetism induction pattern 170 may have a thickness less than that of the tunnel barrier pattern 120. For example, the thickness of the second surface magnetism induction pattern 170 may be equal to or less than half of the thickness of the tunnel barrier pattern 120.

The ferromagnetic pattern 160 may include a perpendicular magnetic layer or a resonance layer. The ferromagnetic pattern 160 may include iron (Fe), nickel (Ni), and/or cobalt (Co).

The second surface magnetism induction pattern 170 may contact the lower surface of the ferromagnetic pattern 160 and induce a perpendicular magnetism therein in addition to the first surface magnetism induction pattern 140, and thus the TMR of the MTJ structure may be much more increased. The second surface magnetism induction pattern 170 may have the thickness less than that of the tunnel barrier pattern 120, and thus the total resistance of the MTJ structure may not be much increased even when the MTJ structure includes the first and second surface magnetism induction patterns 140 and 170.

Figure 3:
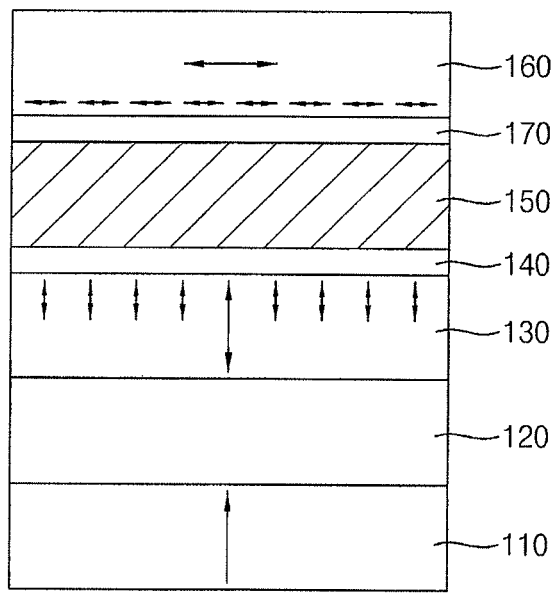
FIG. 3 illustrates a cross-sectional view depicting an MTJ structure of an MRAM device in accordance with example embodiments.

FIG. 3 illustrates a cross-sectional view depicting an MTJ structure of an MRAM device in accordance with example embodiments. The MTJ structure may be substantially the same as or similar to that of FIG. 2, except for characteristics of the second surface magnetism induction pattern 170 and the ferromagnetic pattern 160 as discussed below. Thus, detailed descriptions of like elements are not repeated herein.

Referring to FIG. 3, the second surface magnetism induction pattern 170 may contact a lower surface of the ferromagnetic pattern 160, and may induce an in-plane magnetism to the lower surface of the ferromagnetic pattern 160. The second surface magnetism induction pattern 170 may include. e.g., magnesium oxide (MgO).

The ferromagnetic pattern 160 may include an in-plane magnetic layer or a resonance layer. The ferromagnetic pattern 160 may include iron (Fe), nickel (Ni), and/or cobalt (Co).

The second surface magnetism induction pattern 170 may contact the lower surface of the ferromagnetic pattern 160 and induce an in-plane magnetism therein. In addition, the first surface magnetism induction pattern 140 may contact the upper surface of the free layer pattern 130 and induce a perpendicular magnetism therein. Thus the TMR of the MTJ structure may be greatly increased.

Figure 4:
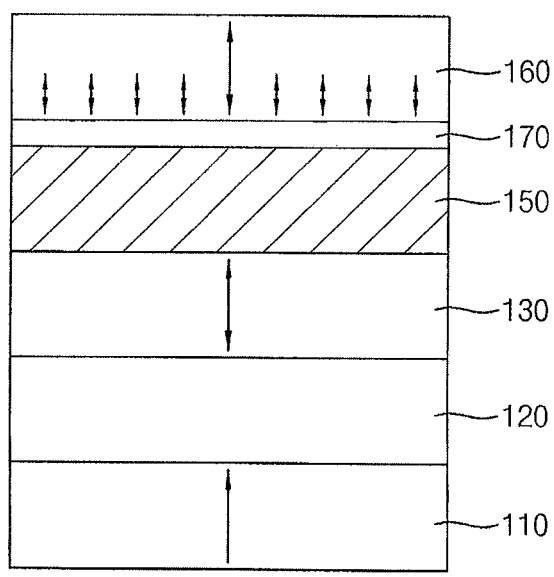
FIG. 4 illustrates a cross-sectional view depicting an MTJ structure of an MRAM device in accordance with example embodiments.

FIG. 4 illustrates a cross-sectional view depicting an MTJ structure of an MRAM device in accordance with example embodiments. The MTJ structure may be substantially the same as or similar to that of FIG. 1, except that the MTJ structure may not include the first surface magnetism induction pattern. Detailed descriptions of like elements are not repeated herein.

Referring to FIG. 4, the MTJ structure may include the fixed layer pattern structure 110, the tunnel barrier pattern 120, the free layer pattern 130, the conductive pattern 150, the second surface magnetism induction pattern 170, and the ferromagnetic pattern 160 sequentially stacked.

The MTJ structure may not include the first surface magnetism induction pattern 140. However, the MTJ structure may include the second surface magnetism induction pattern 170, which contacts the lower surface of the ferromagnetic pattern 160 and induces a perpendicular magnetism therein. Thus, the TMR of the MTJ structure may be increased, while an increase of the MTJ structure due to the first surface magnetism induction pattern 140 may be avoided.

Figure 5:
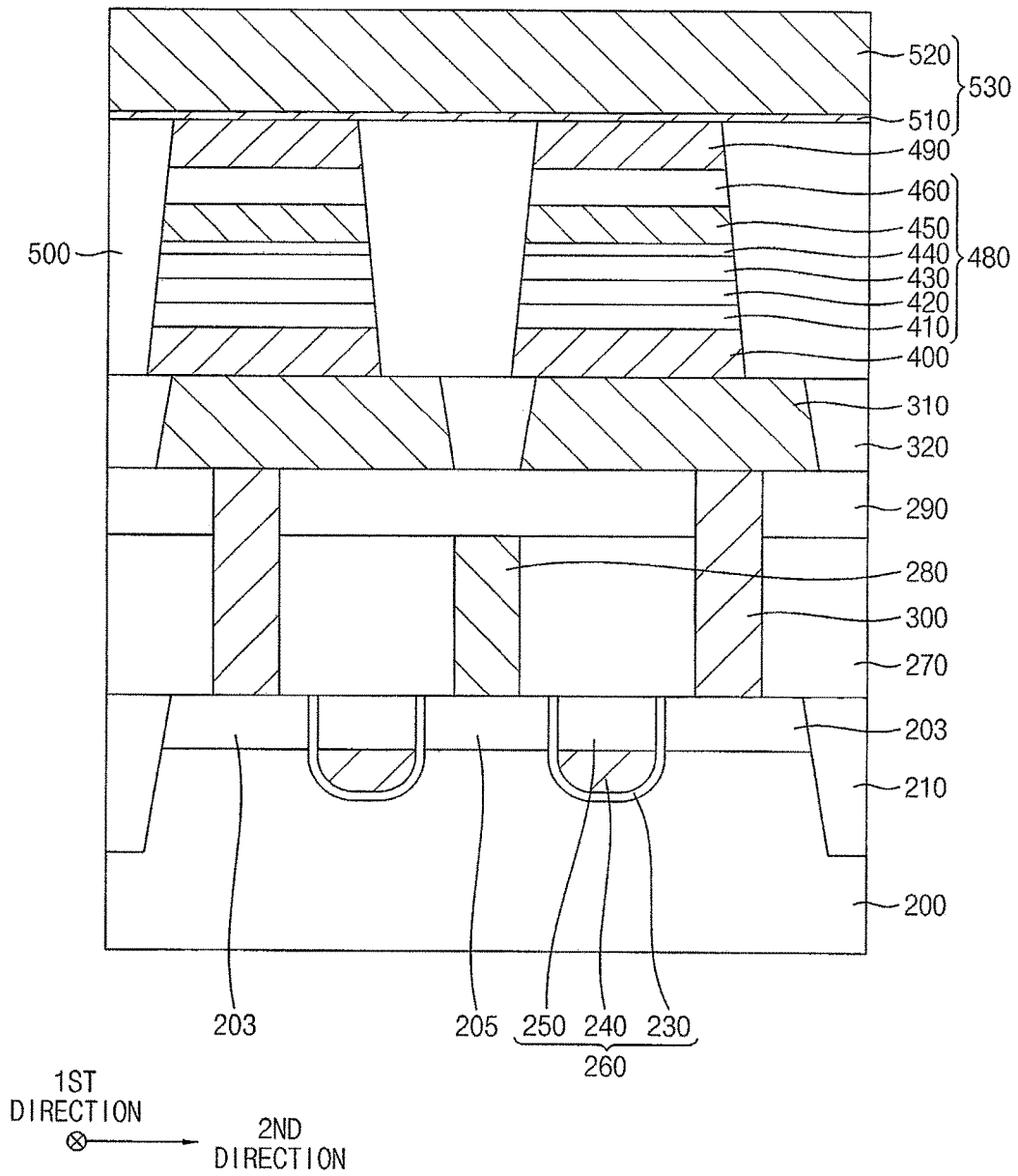
FIG. 5 illustrates a cross-sectional view depicting an MRAM device in accordance with example embodiments.

FIG. 5 illustrates a cross-sectional view depicting an MRAM device in accordance with example embodiments. The MRAM device may include an MTJ structure substantially the same as, or similar to, that of FIG. 1. Detailed descriptions of like elements are not repeated herein.

The MRAM device may include MTJ structures other than that illustrated in FIG. 1. For example, the MRAM device may include the MTJ structures illustrated with reference to FIGS. 2 to 4.

Referring to FIG. 5, the MRAM device may include a transistor, a source line 280, a contact plug 300, a conductive pad 310, a memory unit (including 400, 480, and 490), and a wiring 530 on a substrate 200. The MRAM device may further include first to third insulating interlayers 270, 290 and 500 and an insulation layer 320.

The substrate 200 may include a semiconductor material, e.g., silicon, germanium, silicon-germanium, etc., or III-V semiconductor compounds, e.g., GaP, GaAs, GaSb, etc. In an example embodiment, the substrate 200 may be a silicon-on-insulator (SOI) substrate or a germanium-on-insulator (GOI) substrate.

An isolation layer 210 may be formed on the substrate 200 to divide the substrate 200 into an active region and a field region. The isolation layer 210 may fill a first trench in the substrate 200. The isolation layer 210 may include an oxide, e.g. silicon oxide.

The transistor may include a gate structure 260 and impurity regions 203 and 205.

The gate structure 260 may fill a second trench in the active region of the substrate 200. The gate structure 260 may extend in a first direction substantially parallel to an upper surface of the substrate 200. A plurality of gate structures 260 may be formed in a second direction substantially parallel to the upper surface of the substrate 200 and substantially perpendicular to the first direction. For example, two gate structures 260 may be formed to be spaced apart from each other in the second direction in one active region.

The gate structure 260 may include a gate insulation layer 230 on an inner wall of the second trench, a gate electrode 240 filling a lower portion of the second trench on the gate insulation layer 230, and a capping pattern 250 filling an upper portion of the second trench on the gate insulation layer 230 and the gate electrode 240.

The gate insulation layer 230 may include silicon oxide or a metal oxide. The metal oxide may be or include, e.g., hafnium oxide, tantalum oxide, zirconium oxide, etc. The gate electrode 240 may include a metal, a metal nitride and/or a metal silicide, e.g., tungsten, titanium nitride, tantalum nitride, etc. The capping pattern 250 may include silicon oxide or silicon nitride.

The first and second impurity regions 203 and 205 may be formed at upper portions of the active region of the substrate 200 adjacent the gate structure 260. For example, two first impurity regions 203 and one second impurity region 205 may be formed in one active region. The first and second impurity regions 203 and 205 may include n-type impurities, e.g., phosphorus, arsenic, etc., or p-type impurities, e.g., boron, gallium, etc.

The first insulating interlayer 270 may be formed on the gate structure 260, the substrate 200 and the isolation layer 210. The source line 280 may extend through the first insulating interlayer 270 to contact an upper surface of the second impurity region 205.

The source line 280 may extend in the first direction. A plurality of source lines 280 may be formed in the second direction. For example, the source line 280 may be formed on portions of the substrate 200 and on the isolation layer 210 between neighboring ones of the gate structures 260.

The first insulating interlayer 270 may include an oxide, e.g., silicon oxide. The e source line 280 may include a metal, e.g., tungsten, titanium, tantalum, etc., a metal nitride, e.g., tungsten nitride, titanium nitride, tantalum nitride, etc., or doped polysilicon.

The second insulating interlayer 290 may be formed on the first insulating interlayer 270 and the source line 280. The contact plug 300 may extend through the first and second insulating interlayers 270 and 290 to contact an upper surface of the first impurity region 203.

A plurality of contact plugs 300 may be formed in both of the first and second directions. For example, two contact plugs 300 may be formed to contact two first impurity regions 203, respectively, in each active region.

The second insulating interlayer 290 may include an oxide, e.g., silicon oxide. The contact plug 300 may include a metal. e.g., tungsten, titanium, tantalum, etc., a metal nitride, e.g., tungsten nitride, titanium nitride, tantalum nitride, etc., or doped polysilicon.

The conductive pads 310 may contact upper surfaces of the contact plugs 300, respectively, and the insulation layer 320 may fill spaces between the conductive pads 310.

The conductive pads 310 may include a metal, e.g., tungsten, titanium, tantalum, etc., or a metal nitride, e.g., tungsten nitride, titanium nitride, tantalum nitride, etc. The insulation layer 320 may include a nitride, e.g., silicon nitride.

The memory unit may include a lower electrode 400, an MTJ structure 480, and an upper electrode 490 sequentially stacked on each conductive pad 310.

The upper electrode 490 may cover and protect an upper surface of the MTJ structure 480 in the process for forming the memory unit. Thus, the upper electrode 490 may be also referred to as a capping pattern.

The lower and upper electrodes 400 and 490 may include a metal, e.g., tungsten, copper, aluminum, tantalum, titanium, etc., and/or a metal nitride, e.g., tantalum nitride, titanium nitride, etc.

The MTJ structure 480 may include a fixed layer pattern structure 410, a tunnel barrier pattern 420, a free layer pattern 430, a first surface magnetism induction pattern 440, a conductive pattern 450 and a ferromagnetic pattern 460.

The third insulating interlayer 500 may cover the memory unit, and may be formed on the conductive pads 310 and the insulation layer 320.

The wiring 530 may extend through a portion of the third insulating interlayer 500 to contact an upper surface of the memory unit. A plurality of wirings 530 may be formed in the first direction. Each of the wirings 530 may serve as a bit line of the MRAM device. In example embodiments, the wiring 530 may include a metal pattern 520 and a barrier pattern 510 covering a lower surface and a sidewall of the metal pattern 520.

In the MRAM device, the MTJ structure 480 may include the first surface magnetism induction pattern 440 and the conductive pattern 450. Thus, the MRAM device may have an enhanced TMR and a reduced switching current. Accordingly, the MRAM device including the MTJ structure 480 may have good characteristics.

FIGS. 6 to 10 illustrate cross-sectional views depicting stages of a method of manufacturing an MRAM device in accordance with example embodiments.

Figure 6:
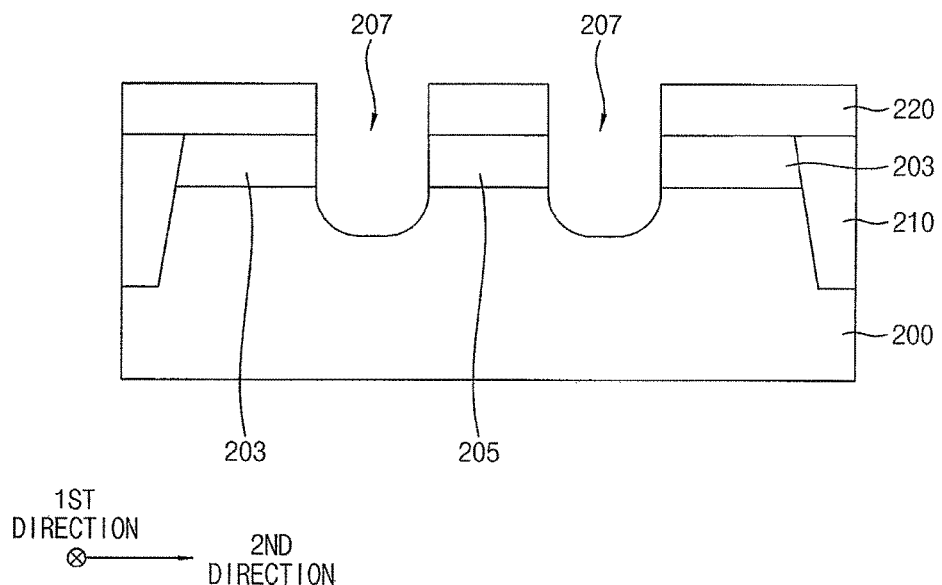
FIGS. 6 to 10 illustrate cross-sectional views depicting stages of a method of manufacturing an MRAM device in accordance with example embodiments.

Referring to FIG. 6, impurities may be implanted into an upper portion of a substrate 200 to form an impurity region. An isolation layer 210 may be formed on the substrate 200 to divide the substrate 200 into an active region and a field region.

The impurities may include n-type impurities, e.g., phosphorus, arsenic, etc., or p-type impurities, e.g., boron, gallium, etc.

The isolation layer 210 may be formed by a shallow trench isolation (STI) process. For example, a first trench may be formed in the substrate 200, an insulation layer may be formed on the substrate 200 to sufficiently fill the first trench, and the insulation layer may be planarized until an upper surface of the substrate 200 may be exposed. The insulation layer may be formed by a chemical vapor deposition (CVD) process, a high density plasma chemical vapor deposition (HDP-CVD) process, etc. In an example embodiment, before forming the isolation layer 210, a liner may be further formed on an inner wall of the first trench to include a nitride.

In some implementations, the impurity region may be formed after forming the isolation layer 210, instead of being formed before forming the isolation layer 210.

An upper portion of the substrate 200 may be partially removed to form a second trench 207.

In example embodiments, a mask layer may be formed on the substrate 200, and may be patterned by a photolithography process to form a mask 220. An upper portion of the substrate 200 may be etched using the mask 220 as an etching mask to form the second trench 207. The second trench 207 may be formed to extend in a first direction substantially parallel to the upper surface of the substrate 200. A plurality of second trenches 207 may be formed in a second direction substantially parallel to the upper surface of the substrate 200 and substantially perpendicular to the first direction. For example, two second trenches 207 may be formed in each active region divided by the isolation layer 210. When the second trenches 207 are formed, the impurity region may be divided into first and second impurity regions 203 and 205.

The mask layer may be formed of, e.g., silicon oxide.

Figure 7:
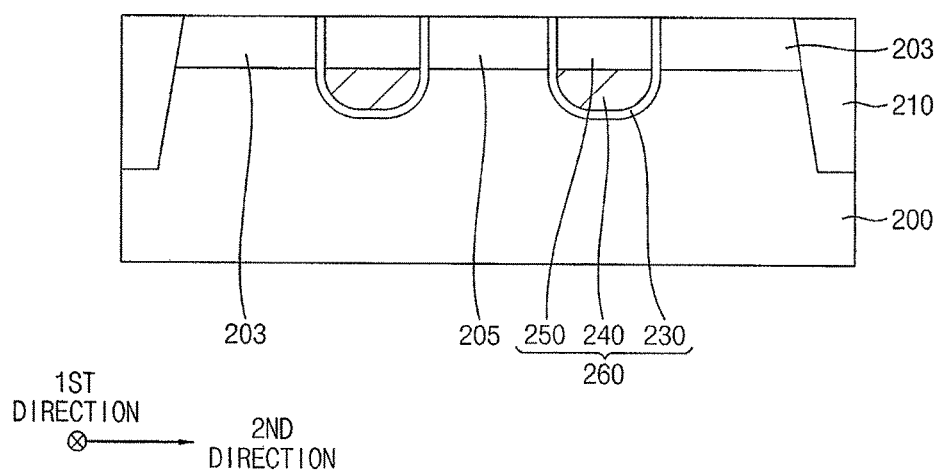

Referring to FIG. 7, a gate insulation layer 230 may be formed on an inner wall of the second trench 207, and a gate electrode layer may be formed on the gate insulation layer 230 and the mask 220 to sufficiently fill the second trench 207.

The gate insulation layer 230 may be formed, for example, by performing a thermal oxidation process or a radical oxidation on the upper portion of the substrate 200 exposed by the second trench 207. In some implementations, the gate insulation layer 230 may be formed by forming a silicon oxide layer or a metal oxide layer on the inner wall of the second trench 207 and the mask 220 through a CVD process, and removing a portion of the silicon oxide layer or the metal oxide layer on the mask 220. The metal oxide layer may be formed of, e.g., hafnium oxide, tantalum oxide, zirconium oxide, etc.

The gate electrode layer may be formed of a metal, a metal nitride and/or a metal silicide, e.g., tungsten, titanium nitride, tantalum nitride, etc., by an atomic layer deposition (ALD) process, a physical vapor deposition (PVD) process, etc.

An upper portion of the gate electrode layer may be removed to form a gate electrode 240 partially filling the second trench 207, and a capping layer may be formed on the gate electrode 240, the gate insulation layer 230 and the mask 220 to fill a remaining portion of the second trench 207.

In example embodiments, the gate electrode layer may be planarized until an upper surface of the mask 220 is exposed by a chemical mechanical polishing (CMP) process. An upper portion of the gate electrode layer in the second trench 207 may be removed by an anisotropic etching process to form the gate electrode 240. Thus, the gate electrode 240 may fill a lower portion of the second trench 207. In example embodiments, the gate electrode 240 may extend in the first direction, and a plurality of gate electrodes 240 may be formed in the second direction.

The capping layer may be formed of, e.g., silicon oxide, silicon nitride, etc.

An upper portion of the capping layer and the mask 220 may be removed by a CMP process until the upper surface of the substrate 200 is exposed to form a capping pattern 250.

Thus, the capping pattern 250 may fill an upper portion of the second trench 207. In example embodiments, the capping pattern 250 may extend in the first direction, and a plurality of capping patterns 250 may be formed in the second direction.

The gate insulation layer 230, the gate electrode 240 and the capping pattern 250 may form a gate structure 260. The gate structure 260 may be a buried structure filling the second trench 207 on the substrate 200. The gate structure 260 may extend in the first direction, and a plurality of gate structures 260 may be formed in the second direction. The gate structure 260 may serve as a word line of the MRAM device. The gate structure 260 and the impurity regions 203 and 205 may form a transistor.

Figure 8:
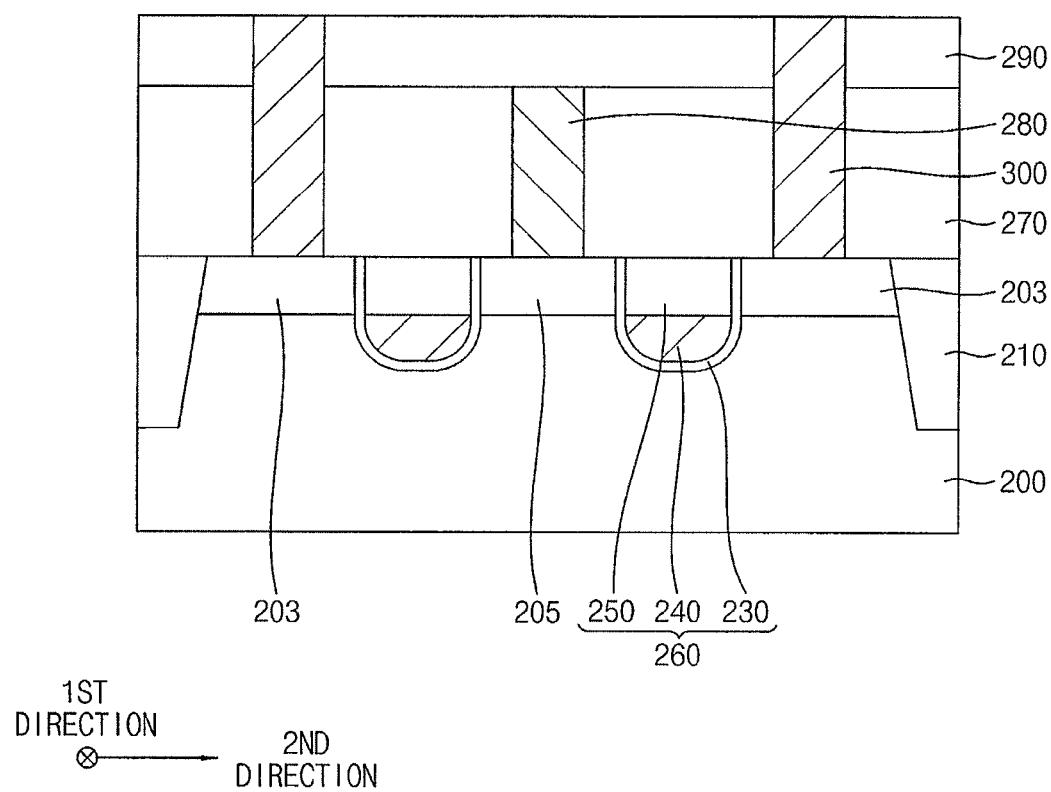

Referring to FIG. 8, a first insulating interlayer 270 may be formed on the gate structure 260, the substrate 200 and the isolation layer 210, and a source line 280 may be formed through the first insulating interlayer 270 to contact the second impurity region 205.

The first insulating interlayer 270 may be formed of an oxide, e.g., silicon oxide.

The source line 280 may be formed of a metal, e.g., tungsten, titanium, tantalum, etc., a metal nitride, e.g., titanium nitride, tantalum nitride, etc., or doped polysilicon.

The source line 280 may extend in the first direction. A plurality of source lines 280 may be formed in the second direction. In example embodiments, each of the source lines 280 may be formed on portions of the substrate 200 and the isolation layer 210 between neighboring ones of the gate structures 260.

A second insulating interlayer 290 may be formed on the first insulating interlayer 270 and the source line 280, and a contact plug 300 may be formed through the first and second insulating interlayers 270 and 290 to contact the first impurity region 203.

The second insulating interlayer 290 may be formed of an oxide, e.g., silicon oxide.

The contact plug 300 may be formed of a metal, e.g., tungsten, titanium, tantalum, etc., a metal nitride, e.g., tungsten nitride, titanium nitride, tantalum nitride, etc., or doped polysilicon.

A plurality of contact plugs 300 may be formed in both of the first and second directions. In some implementations, two contact plugs 300 may be formed to contact two first impurity regions 203, respectively, in each active region.

Figure 9:
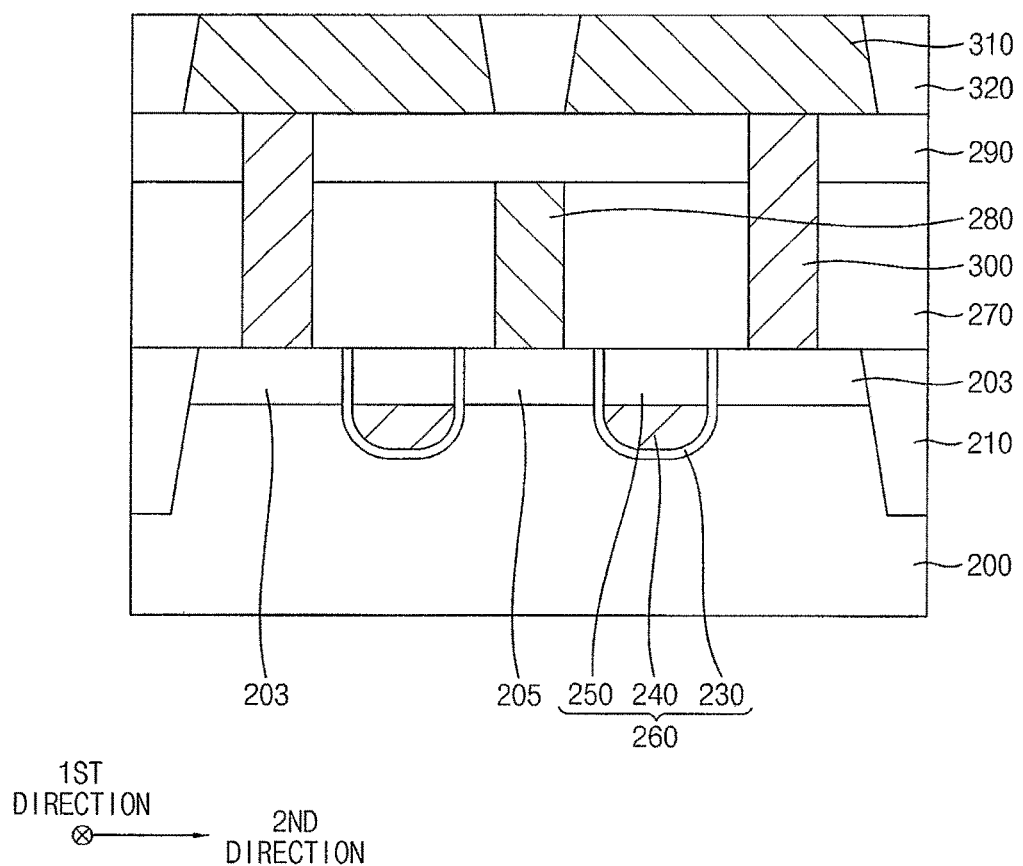

Referring to FIG. 9, a conductive pad layer may be formed on the second insulating interlayer 290 and the contact plug 300. The conductive pad layer may be patterned to form conductive pads 310. An insulation layer 320 may be formed to fill spaces between the conductive pads 310.

The conductive pad layer may be formed of a metal, e.g., tungsten, titanium, tantalum, etc., or a metal nitride, e.g., tungsten nitride, titanium nitride, tantalum nitride, etc., and the insulation layer 320 may be formed of a nitride, e.g., silicon nitride.

In example embodiments, the conductive pads 310 may be formed to contact upper surfaces of the contact plugs 300, respectively.

Figure 10:
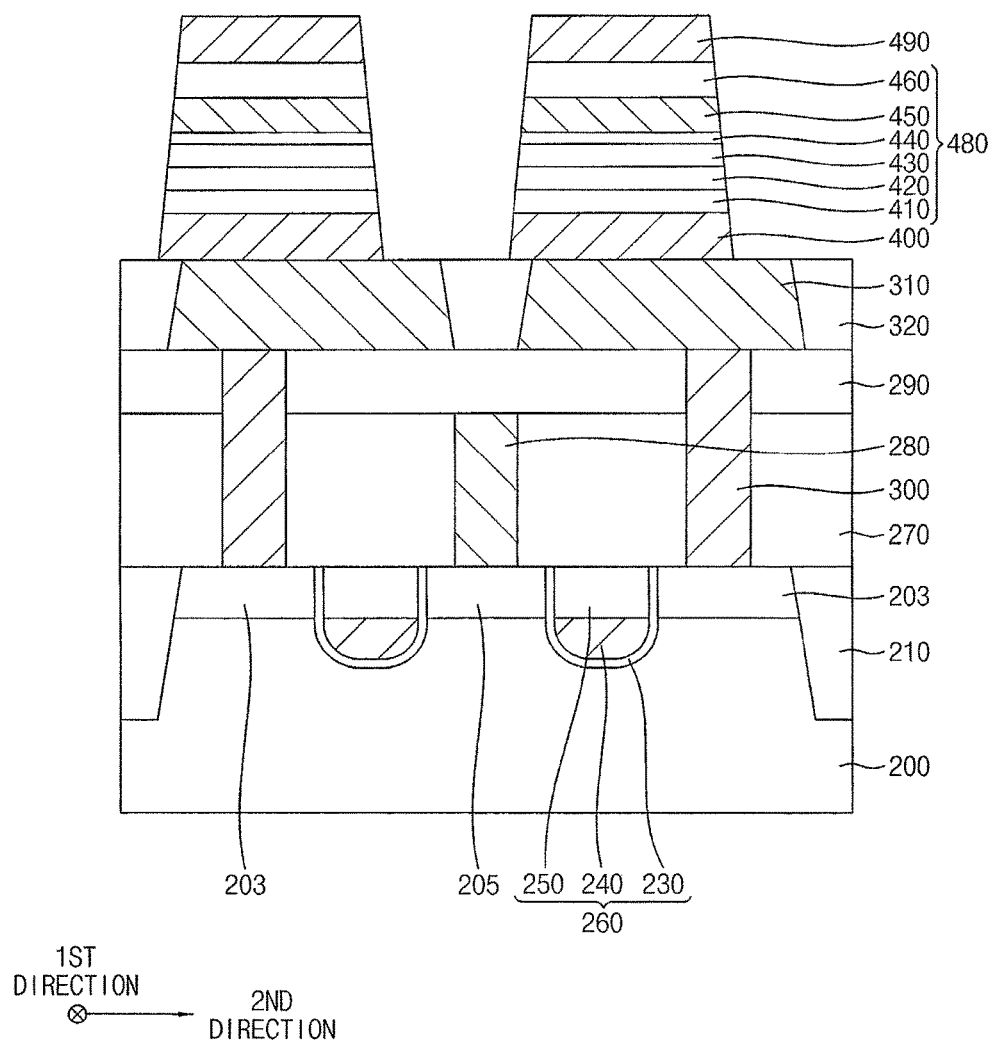

Referring to FIG. 10, a lower electrode layer, an MTJ layer structure, and an upper electrode layer may be sequentially formed on the insulation layer 320 and the conductive pads 310. These layers may be patterned to form a lower electrode 400, an MTJ structure 480 and an upper electrode 490, respectively.

Thus, a memory unit including the lower electrode 400, the MTJ structure 480, and the upper electrode 490 sequentially stacked may be formed each conductive pad 310 and the insulation layer 320.

In example embodiments, the MTJ structure 480 may include a fixed layer pattern structure 40, a tunnel barrier pattern 420, a free layer pattern 430, a first surface magnetism induction pattern 440, a conductive pattern 450 and a ferromagnetic pattern 460 sequentially stacked.

Referring to FIG. 5 again, a third insulating interlayer 500 may be formed on the conductive pads 310 and the insulation layer 320 to cover the memory unit. An opening may be formed to expose the upper electrode 490, and a wiring 530 may be formed on the exposed upper electrode 490 to fill the opening.

The wiring 530 may include a metal pattern 520 and a barrier pattern 510 covering a bottom and a sidewall of the metal pattern 520. A plurality of wirings 530 may be formed in the first direction. Each wiring 530 may serve as a bit line of the MRAM device.

By way of summation and review, in an MRAM device including a magnetic tunnel junction (MTJ) structure, it is desirable to reduce a switching current of the MTJ structure. In order to reduce the switching current of the MTJ structure, two tunnel barrier patterns may be formed on and beneath, respectively, a free layer pattern, however, in this case, the total resistance of the MTJ structure may increase.

Embodiments provide an MTJ structure having good characteristics and an MRAM device including the MTJ structure.

The MTJ structure may include the first surface magnetism induction pattern that may contact the upper surface of the free layer pattern and induce a perpendicular magnetism therein, and thus the TMR of the MTJ structure may be increased. The first surface magnetism induction pattern may have the thickness less than that of the tunnel barrier pattern, and thus the total resistance of the MTJ structure may not be much increased even if the MTJ structure includes the first surface magnetism induction pattern.

The MTJ structure may include the conductive pattern, which may include a metal, between the free layer pattern and the ferromagnetic pattern, which may include a ferromagnetic material, and thus may cause a spin torque between the free layer pattern and the ferromagnetic pattern by free electrons included in the metal, and thus the switching current of the MTJ structure may be reduced. The conductive pattern may include the metal, and thus the total resistance of the MTJ structure may be decreased Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A magnetic tunnel junction (MTJ) structure, comprising:
   a fixed layer pattern structure having a perpendicular magnetization direction;
   a tunnel barrier pattern on the fixed layer pattern structure;
   a free layer pattern on the tunnel barrier pattern, the free layer pattern having a perpendicular magnetization direction;
   a first surface magnetism induction pattern on the free layer pattern, the first surface magnetism induction pattern inducing a perpendicular magnetism in a surface of the free layer pattern;
   a conductive pattern on the first surface magnetism induction pattern;
   a ferromagnetic pattern on the conductive pattern, and
   a second surface magnetism induction pattern between the conductive pattern and the ferromagnetic pattern, wherein the second surface magnetism induction pattern includes magnesium oxide (MgO).

2. The MTJ structure as claimed in claim 1, wherein the ferromagnetic pattern has a perpendicular magnetization direction.

3. The MTJ structure as claimed in claim 2, wherein the second surface magnetism induction pattern induces a perpendicular magnetism in a surface of the ferromagnetic pattern.

4. The MTJ structure as claimed in claim 3, wherein the second surface magnetism induction pattern has a thickness less than that of the tunnel barrier pattern.

5. The MTJ structure as claimed in claim 1, wherein the ferromagnetic pattern has an in-plane magnetization direction.

6. The MTJ structure as claimed in claim 1, wherein the ferromagnetic pattern includes a resonance layer.

7. The MTJ structure as claimed in claim 1, wherein the first surface magnetism induction pattern includes magnesium oxide (MgO).

8. The MTJ structure as claimed in claim 1, wherein the first surface magnetism induction pattern has a thickness that is less than that of the tunnel barrier pattern.

9. The MTJ structure as claimed in claim 8, wherein the thickness of the first surface magnetism induction pattern is equal to or less than half of the thickness of the tunnel barrier pattern.

10. The MTJ structure as claimed in claim 1, wherein the tunnel barrier pattern includes magnesium oxide (MgO) or aluminum oxide (AlOx).

11. The MTJ structure as claimed in claim 1, wherein the ferromagnetic pattern includes at least one of iron, nickel, and cobalt.

12. The MTJ structure as claimed in claim 1, wherein the conductive pattern includes a metal.

13. The MTJ structure as claimed in claim 12, wherein the conductive pattern includes at least one of copper, aluminum and tungsten.

* * * * *